US011276351B2

(12) United States Patent
Lee et al.

(10) Patent No.: US 11,276,351 B2
(45) Date of Patent: Mar. 15, 2022

(54) DISPLAY DEVICE

(71) Applicant: SAMSUNG DISPLAY CO., LTD., Yongin-si (KR)

(72) Inventors: Kwang Sae Lee, Asan-si (KR); Won Kyu Kwak, Seongnam-si (KR); Ki Myeong Eom, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/793,404

(22) Filed: Feb. 18, 2020

(65) Prior Publication Data
US 2020/0265783 A1 Aug. 20, 2020

(30) Foreign Application Priority Data

Feb. 19, 2019 (KR) .......................... 10-2019-0019062

(51) Int. Cl.
G09G 3/3266 (2016.01)
G09G 3/00 (2006.01)
G09G 3/3241 (2016.01)
H01L 27/32 (2006.01)

(52) U.S. Cl.
CPC ............ *G09G 3/3266* (2013.01); *G09G 3/006* (2013.01); *G09G 3/3241* (2013.01); *H01L 27/323* (2013.01); *H01L 27/3276* (2013.01); *G09G 2300/0426* (2013.01); *G09G 2330/12* (2013.01); *G09G 2380/02* (2013.01)

(58) Field of Classification Search
CPC .............. H01L 27/3276; H01L 27/323; H01L 51/0031; G09G 3/3241; G09G 3/3266; G09G 3/006; G09G 2330/12; G09G 3/3208; G09G 2300/0426; G09G 2380/02
See application file for complete search history.

(56) References Cited

U.S. PATENT DOCUMENTS

| 2011/0141042 | A1* | 6/2011 | Kim ...................... G06F 3/0412 345/173 |
| 2016/0232826 | A1* | 8/2016 | Cho .................... H01L 27/3276 |
| 2018/0033354 | A1 | 2/2018 | Lee et al. |
| 2018/0053466 | A1* | 2/2018 | Zhang ...................... G09G 3/20 |
| 2018/0158741 | A1 | 6/2018 | Kim et al. |
| 2018/0158894 | A1* | 6/2018 | Park .................... H01L 51/5253 |

(Continued)

FOREIGN PATENT DOCUMENTS

| CN | 108417561 | 8/2018 |
| EP | 3330951 | 6/2018 |

(Continued)

OTHER PUBLICATIONS

Extended European Search Report dated Jun. 19, 2020 Corresponding to European Patent Application No. 20157843.2.

*Primary Examiner* — Abbas I Abdulselam
(74) *Attorney, Agent, or Firm* — F. Chau & Associates, LLC

(57) ABSTRACT

A display device includes a display panel including an opening and a plurality of pixels that display an image, a crack detection line disposed along a periphery of the opening, and a plurality of data lines connected to the plurality of pixels. The crack detection line is connected to one of the plurality of data lines, and detects a crack at the periphery of the opening through a single pixel array connected to the one of the plurality of data lines.

18 Claims, 7 Drawing Sheets

(56) References Cited

U.S. PATENT DOCUMENTS

| | | | |
|---|---|---|---|
| 2018/0350284 A1 | 12/2018 | Park et al. | |
| 2019/0019441 A1* | 1/2019 | Shin | H01L 27/3276 |
| 2019/0305065 A1 | 10/2019 | Kim et al. | |
| 2020/0106055 A1* | 4/2020 | Zhang | H01L 51/5092 |
| 2020/0135595 A1 | 4/2020 | Kim et al. | |
| 2020/0143722 A1 | 5/2020 | Lee et al. | |

FOREIGN PATENT DOCUMENTS

| | | |
|---|---|---|
| EP | 3648087 | 5/2020 |
| KR | 10-2018-0065061 | 6/2018 |
| KR | 10-2018-0093191 | 8/2018 |
| KR | 16-2018-0109390 | 10/2018 |
| KR | 10-2019-0115135 | 10/2019 |
| KR | 10-2020-0051099 | 5/2020 |

\* cited by examiner

HCD Hole Crack

DISPLAY DEVICE

CROSS-REFERENCE TO RELATED APPLICATIONS

This application claims priority under 35 U.S.C. § 119 to Korean Patent Application No. 10-2019-0019062, filed in the Korean Intellectual Property Office on Feb. 19, 2019, the disclosure of which is incorporated by reference herein in its entirety.

TECHNICAL FIELD

Exemplary embodiments of the present invention relate to a display device, and more particularly, to a display device having an opening.

DISCUSSION OF THE RELATED ART

In recent years, users of portable electronic devices have been increasingly carrying only one electronic device such as, for example, a smartphone, having a built-in camera function, rather than also carrying a separate camera.

Conventionally, a camera is disposed in an area outside of an image display area of an electronic device. For example, a camera is typically disposed in a bezel area outside of the image display area. As a result, the display area in which an image is displayed tends to be reduced.

SUMMARY

Exemplary embodiments provide a display device that can detect a crack generated at a periphery of an opening(s) of the display device.

In addition, when the display device detects a crack occurring in another portion other than the periphery of the opening(s), the display device can efficiently detect where the crack occurs while distinguishing the locations of the cracks.

According to an exemplary embodiment, a display device includes a display panel including an opening and a plurality of pixels that display an image, a crack detection line disposed along a periphery of the opening, and a plurality of data lines connected to the plurality of pixels. The crack detection line is connected to one of the plurality of data lines, and detects a crack at the periphery of the opening through a single pixel array connected to the one of the plurality of data lines.

In an exemplary embodiment, a first end of the crack detection line receives a detection voltage through a voltage application signal line.

In an exemplary embodiment, a second end of the crack detection line is connected to a detection signal line, and the detection signal line is connected to the one of the plurality of data lines.

In an exemplary embodiment, the display panel includes a lower display panel including a bending portion and a driving portion, and an upper display panel disposed on the lower display panel.

In an exemplary embodiment, the lower display panel includes a display area including the plurality of pixels, and a peripheral area disposed near the display area. The bending portion and the driving portion are disposed in the peripheral area, and the bending portion and the driving portion protrude in one direction away from the display area.

In an exemplary embodiment, the opening is disposed in the display area.

In an exemplary embodiment, at least one of the plurality of pixels includes an organic light emitting diode and a driving transistor that supplies a current to the organic light emitting diode.

In an exemplary embodiment, the voltage application signal line includes a voltage application line disposed in the upper display panel and a peripheral voltage application line disposed in the lower display panel.

In an exemplary embodiment, the peripheral voltage application line is disposed across the bending portion and the driving portion of the lower display panel.

In an exemplary embodiment, the voltage application line and the peripheral voltage application line are electrically connected to each other through a voltage application line pad.

In an exemplary embodiment, the detection signal line includes a detection line disposed in the upper display panel and a peripheral detection line disposed in the lower display panel.

In an exemplary embodiment, the peripheral detection line is disposed across the bending portion and the driving portion in the lower display panel.

In an exemplary embodiment, the detection line and the peripheral detection line are electrically connected to each other through a detection line pad.

In an exemplary embodiment, the upper display panel includes a touch sensor that senses a touch.

In an exemplary embodiment, the display device further includes a display panel crack detection wire that detects a crack of the display panel.

In an exemplary embodiment, a first end of the display panel crack detection wire receives the detection voltage, and a second end of the display panel crack detection wire is connected to the one of the plurality of data lines.

In an exemplary embodiment, the display panel crack detection wire is disposed across the bending portion and the driving portion of the lower display panel and an outer edge of the display area.

In an exemplary embodiment, the display device further includes a bending portion crack detection wire that detects a crack in the bending portion.

In an exemplary embodiment, a first end of the bending portion crack detection wire receives the detection voltage, and a second end of the bending portion crack detection wire is connected to the one of the plurality of data lines.

In an exemplary embodiment, the bending portion crack detection wire is disposed across the bending portion and the driving portion of the lower display panel.

According to an exemplary embodiment, a display device includes a display panel including an opening and a plurality of pixels that display an image, a crack detection line disposed along a periphery of the opening, and a plurality of data lines connected to the plurality of pixels. The crack detection line is connected to one of the plurality of data lines, and a single pixel array connected to the one of the plurality of data lines displays a luminance in response to detection of a crack at the periphery of the opening.

In an exemplary embodiment, a first end of the crack detection line receives a detection voltage through a voltage application signal line.

In an exemplary embodiment, a second end of the crack detection line is connected to a detection signal line, and the detection signal line is connected to the one of the plurality of data lines.

According to exemplary embodiments, an occurrence of a crack at the periphery of an opening(s) can be detected through the detection line disposed at the periphery of the opening(s). In addition, when the display device detects a crack occurring in another portion other than the periphery of the opening(s), the display device can efficiently detect where the crack occurs while distinguishing the locations of the cracks.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION

Figure 1:
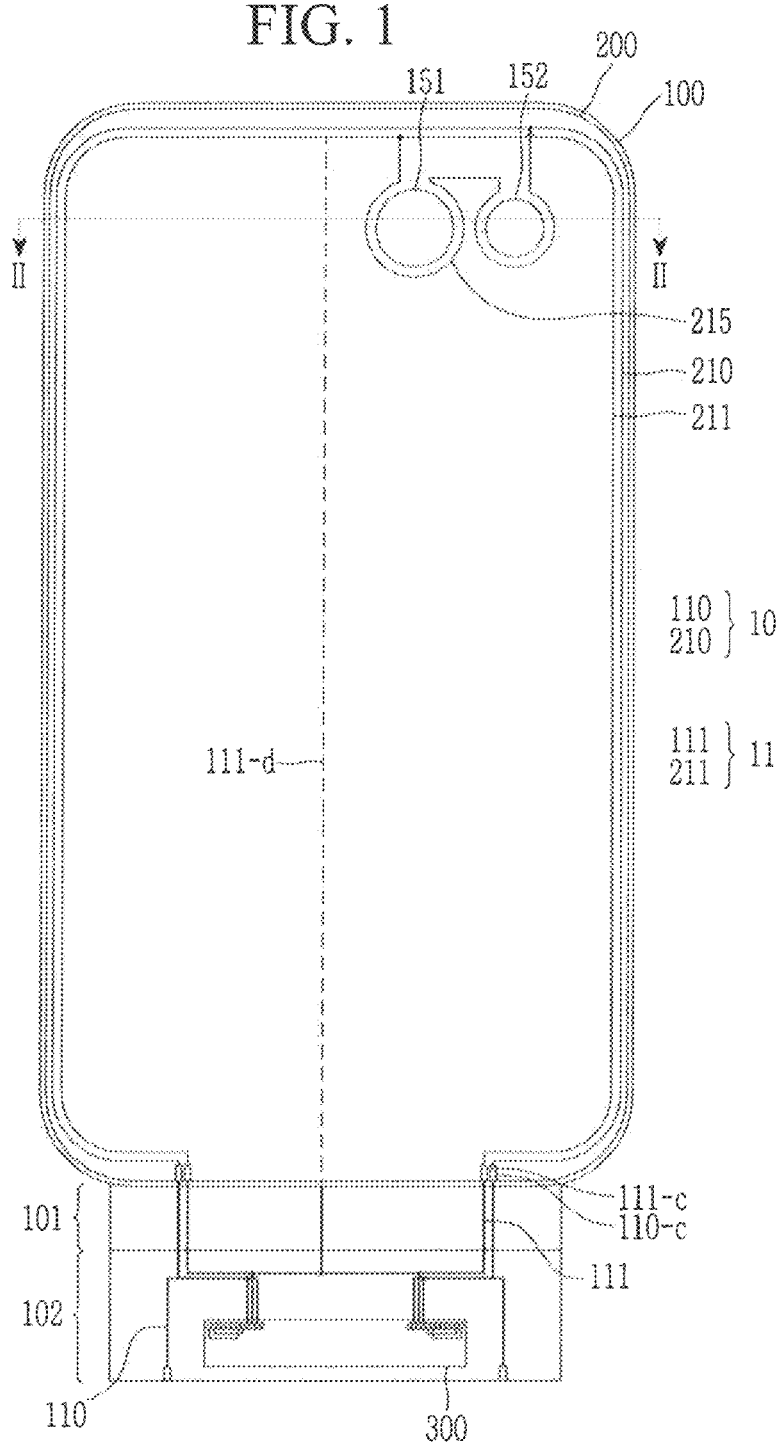
FIG. 1 is a top plan view of a display device according to an exemplary embodiment.

Exemplary embodiments of the present invention will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words use to describe the relationship between elements should be interpreted in a like fashion.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

As used herein, the singular forms "a", "an" and "the" are intended to include the plural forms as well, unless the context clearly indicates otherwise.

Hereinafter, a display device according to an exemplary embodiment will be described with reference to FIGS. 1 and 2.

Figure 2:
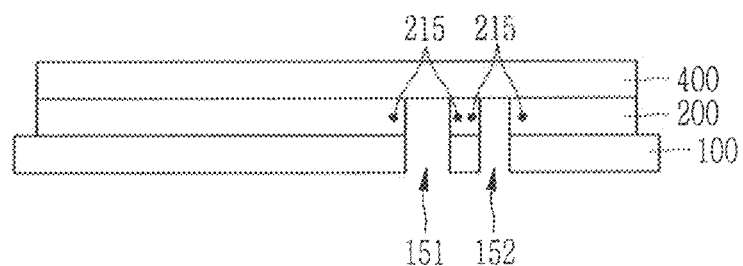
FIG. 2 is a cross-sectional view of the display device of FIG. 1 taken along line II-II.

FIG. 1 is a top plan view of a display device according to an exemplary embodiment, and FIG. 2 is a cross-sectional view of the display device of FIG. 1 taken along line II-II.

Referring to FIGS. 1 and 2, a display device according to an exemplary embodiment includes an lower display panel 100 and a upper display panel 200 that include openings 151 and 152, and a crack detection line 215 that is formed in the lower and upper display panels 100 and 200. The openings may include a first opening 151 and a second opening 152. The lower display panel 100 may also be referred to herein as an lower display portion, and the upper display panel 200 may also be referred to herein as a upper display portion.

In the exemplary embodiment of FIGS. 1 and 2, the crack detection line 215 is disposed in the upper display panel 200. Here, the crack detection line 215 can detect the generation of cracks due to a disconnection in the crack detection line 215, which occurs when a crack is generated at the periphery of the openings 151 and 152.

Various methods may be used to determine whether a disconnection occurs in the crack detection line 215. In the exemplary embodiment of FIGS. 1 and 2, the occurrence of a disconnection is determined in a manner in which a detection voltage is not applied due to a disconnection, and accordingly, a pixel array display displays luminance. That is, when a crack causes a disconnection in the crack detection line 215, a detection voltage that would be applied if no crack was present is not applied. As a result, a pixel array display displays luminance. Regarding the displayed luminance, according to exemplary embodiments, the pixel array displaying the disconnection may be a pixel column that has pixels connected to one data line, and luminance may be displayed in correspondence with the pixel array connected to the one data line (see FIG. 6).

The structure shown in FIGS. 1 and 2 will now be described in more detail.

As shown in FIGS. 1 and 2, the display device includes the lower display panel 100, the upper display panel 200, and a window 400 that covers the upper display panel 200. The window may be disposed on and contact the upper display panel 200. In an exemplary embodiment, end portions of the window 400 may be aligned with end portions of the upper display panel 200, and end portions of the lower display panel 100 may extend beyond the edges of the window 400 and the upper display panel 200, as shown in FIG. 2. Two openings 151 and 152 are formed in the lower display panel 100 and the upper display panel 200. The lower display panel 100 and the upper display panel 200 may be collectively referred to herein as a display panel. Although FIG. 1 illustrates that the number of openings is two, the present invention is not limited thereto. For example, according to exemplary embodiments, the number of openings may be only one or three or more.

The lower display panel 100 includes a display area in which an image is displayed and a peripheral area that is disposed at the periphery of the display area. In an exemplary embodiment, the peripheral area includes a display bending portion 101 and a driving portion 102 that protrude in one direction away from the display area. The bending portion 101 and the driving portion 102 may also be referred to herein as a peripheral area of the display device.

The display area includes a plurality of pixels. Among the plurality of pixels, one pixel is formed on one organic light emitting diode and one diode driver that applies a current to the organic light emitting diode. A plurality of pixels disposed in a display area of the lower display panel 100 are covered by an encapsulation layer. The encapsulation layer blocks permeation of moisture or air into an emission layer of the organic light emitting diode. The display area may have a size that is similar to a size of the upper display panel 200. For example, the size of the display area may correspond to the size of the upper display panel 200. The two openings 151 and 152 are disposed in the display area. However, the two openings 151 and 152 do not display an image because pixels are not formed in areas in which the openings 151 and 152 are located and at the periphery thereof.

The peripheral area of the lower display panel 100 may be disposed in any area in the left, right, top, and bottom areas in the display portion in addition to the bending portion 101 and the driving portion 102 in FIG. 1, and may be disposed between the bending portion 101 and the display area. According to exemplary embodiments, the peripheral area disposed at the periphery of the display area may have a very narrow width, or the width may be removed.

The lower display panel 100 is formed by forming a pixel (e.g., a diode driver and an organic light emitting diode) on a flexible substrate formed of, for example, plastic or an organic polymer material, and has a flexible characteristic.

The bending portion 101 of the peripheral area of the lower display panel 100 is a portion bent toward a bottom side of the lower display panel 100 by using a flexible property of the substrate, and signal wires that connect the display area and the driving portion 102 are formed therein. In FIG. 1, only some of the signal wires are illustrated for convenience of description. For example, FIG. 1 illustrates only a first data line 111-d among a plurality of data lines. A plurality of pixel arrays are connected along one data line, and thus, a voltage applied to a single data line affects the entire single pixel array.

The upper display panel 200 may include a touch sensor that senses a touch, a voltage application line 210, a detection line 211, and a crack detection line 215 that are formed at an outer edge of the upper display panel 200 and the periphery of the openings 151 and 152.

The upper display panel 200 displays an image, excluding some of the outer edge of the upper display panel 200 and the periphery of the openings 151 and 152, in correspondence with pixels of the lower display panel 100. In FIG. 1, according to an exemplary embodiment, areas in which the voltage application line 210, the detection line 211, and the crack detection line 215 are areas in which an image is not displayed.

The upper display panel 200 may also be called a touch sensor that is additionally formed on pixels after the pixels (e.g., a diode driver and an organic light emitting diode) are formed on a flexible substrate disposed in the lower display panel 100, and then sealing the pixels with a sealant. However, the present invention is not limited thereto. For example, according to exemplary embodiments, a separate flexible substrate in which a touch sensor is formed may be included.

When the openings 151 and 152 are formed, a process for removing a corresponding area from among the lower display panel 100 and the upper display panel 200 is performed. In this case, a crack may be generated in the lower display panel 100 and/or the upper display panel 200. To detect generation of the crack, in an exemplary embodiment, the crack detection line 215 is formed along the periphery of the first opening 151 and the second opening 152. For example, in an exemplary embodiment, the crack detection line 215 extends along an outer edge of each of the first opening 151 and the second opening 152. As shown in FIG. 1, in an exemplary embodiment, the crack detection line 215 may extend along less than the entirety of the periphery of each of the first opening 151 and the second opening 152 (see also FIG. 3). In addition, referring to FIG. 2, the crack detection line 215 is formed in the upper display panel 200.

The crack detection line 215 is connected to a voltage application signal line 10 and receives a detection voltage.

The crack detection line 215 transmits the detection voltage supplied from the voltage application signal line 10 to a detection signal line 11. The detection signal line 11 is connected to the first data line 111-d and the detection voltage is transmitted to the first data line 111-d.

As shown in FIG. 1, the voltage application signal line 10 may include the voltage application line 210 and a peripheral voltage application line 110. The voltage application line 210 and the crack detection line 215 are formed in the upper display panel 200. The peripheral voltage application line 110 is formed in the lower display panel 100. For example, the peripheral voltage application line 110 may be formed in the peripheral area (e.g., the display bending portion 101 and the driving portion 102) in the lower display panel 100. The voltage application line 210 and the peripheral voltage application line 110 are electrically connected to each other through a voltage application line pad 110-c.

Further, as shown in FIG. 1, the detection signal line 11 includes a peripheral detection line 111 and a detection line 211. Like the voltage application line 210 and the crack detection line 215, the detection line 211 is formed in the upper display panel 200. The peripheral detection line 111 is formed in the lower display panel 100. For example, peripheral detection line 111 may be formed in the peripheral area (e.g., the display bending portion 101 and the driving portion 102) in the lower display panel 100. The peripheral detection line 111 and the detection line 211 are electrically connected to each other through a detection line pad 111-c.

The voltage application line pad 110-c and the detection line pad 111-c may be formed in the lower display panel 100.

Hereinafter, a signal applied to the voltage application signal line 10 and the detection signal line 11 will be described.

The voltage application signal line 10 receives a detection voltage from the outside and transmits the received detection voltage to the crack detection line 215. In this case, as shown in FIG. 1, the voltage application signal line 10 may be a structure that is symmetrical on both sides (e.g., both longer sides) of the display device, and the same detection voltage is applied to both sides. In addition, according to exemplary embodiments, the voltage application signal line 10 may be connected to one terminal of a driving chip 300 and may receive a detection voltage from the driving chip 300.

One end of the crack detection line 215 is connected to the voltage application signal line 10, and the other end thereof is connected to the detection signal line 11. Thus, the detection voltage transmitted to the crack detection line 215 from the voltage application signal line 10 is transmitted to the detection signal line 11.

The detection signal line 11 may also have a structure that is symmetrical on both sides (e.g., both longer sides) of the display device. Wires extended from opposite sides meet in the peripheral area (e.g., the display bending portion 101 and the driving portion 102), the same detection voltage is applied to both sides, and the detection signal line 11 is electrically connected to the first data line 111-*d*. Thus, the detection voltage is transmitted to the first data line 111-*d*.

If a crack is generated at the periphery of the openings 151 and 152, thus causing the crack detection line 215 to become disconnected, the detection voltage is not transmitted to the detection signal line 11 and the first data line 111-*d*.

In an exemplary embodiment, when the detection voltage is applied to the first data line 111-*d* to detect the generation of cracks, a pixel array connected to the first data line 111-*d* does not separately emit light. In contrast, when the detection voltage is not applied to the first data line 111-*d*, the pixel array connected to the first data line 111-*d* emits light, thereby displaying luminance (refer to FIG. 6).

For this purpose, in an exemplary embodiment, a driving voltage ELVDD, which is a high voltage for driving a pixel including an organic light emitting diode, is applied as the detection voltage. When the driving voltage ELVDD is applied to a data line, a source and gate of a driving transistor that emits a current to the organic light emitting diode do not have a voltage difference such that a driving current is not output. When a disconnection occurs, thus causing the high voltage not to be applied, the source and the gate of the driving transistor have a voltage difference such that the driving current is output and the organic light emitting diode emits light.

According to exemplary embodiments, the generation of cracks may be detected by reading a voltage value returned through the detection signal line 11 in the driving chip 300 rather than by light emission from the pixel array.

By such a structure, when the crack is generated at the periphery of the openings 151 and 152, the crack detection line 215 is disconnected, and thus the pixel array connected to the first data line 111-*d* emits luminance, thereby being displayed as a bright line. Accordingly, the generation of cracks at the periphery of the openings 151 and 152 can be determined.

According to exemplary embodiments, the generation of the crack can be determined during a process of forming the openings 151 and 152. As a result, a more precise result can be provided to an inspector.

Referring to FIG. 2, the display device according to an exemplary embodiment includes the window 400, and the openings 151 and 152 are not formed in the window 400. The window 400 may prevent permeation of a foreign material through a front side into the openings 151 and 152 of the display device. The window 400 may be formed of a material having a flexible characteristic, and a polarizer may be attached to one side of the window 400. The polarizer may be included to prevent light incident from the outside to the window 400 from being reflected by a touch sensing wire and an electrode, thereby causing visibility of the wire and the electrode to a user.

An optical element such as, for example, a flash, or various electronic elements such as, for example, an infrared ray or ultraviolet ray sensor, may be located in a bottom side or inside the openings 151 and 152.

Referring back to FIG. 1, a wiring connection relationship in a portion of the openings 151 and 152 will be described in detail.

The voltage application line 210 is formed along an outer edge of the upper display panel 200, and may be formed in an area that does not overlap with a display area. The voltage application line 210 is electrically connected to the peripheral voltage application line 110 of the lower display panel 100 through the voltage application line pad 110-*c* in the bending portion 101 of the lower display panel 100. Accordingly, the detection voltage is also transmitted to the voltage application line 210 of the upper display panel 200.

In addition, the detection line 211 is formed along an outer edge of the upper display panel 200, and may be formed in an area that does not overlap the display area. Opposite ends of the detection line 211 are electrically connected to the peripheral detection line 111 of the lower display panel 100 through the detection line pad 111-*c*.

Holes are physically formed in the upper display panel 200 and the lower display panel 100 to form the openings 151 and 152, and the crack detection line 215 is formed along the periphery of the openings 151 and 152. Thus, when cracks are generated at the periphery of the openings 151 and 152, the corresponding crack detection line 215 can become disconnected. For this purpose, the openings 151 and 152 and the crack detection lines 215 are formed adjacent to each other. In an exemplary embodiment, the openings 151 and 152 and the crack detection line 215 are formed directly adjacent to each other with no intervening elements present.

That is, the crack detection line 215 is formed along the periphery of the openings 151 and 152, and opposite ends of the crack detection line 215 are connected to the detection line 211 and the voltage application line 210. Thus, the detection voltage received from the voltage application line 210 can be transmitted to the detection line 211 when no cracks are present. When the crack detection line 215 is disconnected, for example, due to a crack, the detection voltage is not transmitted to the detection line 211. As a result, the generation of cracks at the periphery of the openings 151 and 152 can be determined.

Hereinafter, a method of detecting the generation of cracks at the periphery of the openings 151 and 152 and other portions according to an exemplary embodiment will be described with reference to FIG. 3.

Figure 3:
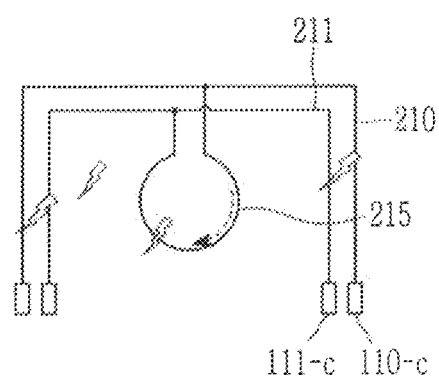
FIG. 3 schematically illustrates a method of detecting a crack in the display device of FIG. 1 according to an exemplary embodiment.

FIG. 3 schematically illustrates a method of detecting cracks in the display device of FIG. 1 according to an exemplary embodiment.

FIG. 3 illustrates a structure in which the crack detection line 215 is connected to the detection line 211 and the voltage application line 210, and the voltage application line pad 110-*c* and the detection line pad 111-*c* are connected to ends of the lines 210 and 211, respectively. In addition, portions where cracks may be generated are marked by lightning bolts, which are shown in various positions in FIG. 3.

Exemplary embodiments are directed at detecting cracks generated in a position corresponding to the crack detection line 215, the detection line 211, and the voltage application line 210, which are disposed to correspond to the openings 151 and 152. The location and the number of the openings 151 and 152 are not limited to the location and number shown in FIG. 1. Thus, according to exemplary embodiments, the locations of the openings 151 and 152, the crack detection line 215, the detection line 211, and the voltage application line 210 may be variously modified to detect cracks generated at different locations of the display panels 100 and 200 corresponding to the location(s) at which an opening(s) is disposed.

A position at which the crack is generated, thereby causing a disconnection, is on the crack detection line 215 and the detection line 211, and in the case of the detection line 211, the crack may be generated in both the left and right sides of the detection line 211.

First, when a disconnection occurs in the crack detection line 215, a detection voltage applied from the voltage application line 210 is not transmitted to the detection line 211. Thus, the detection voltage is not applied to the detection line pad 111-c, and accordingly, the first data line 111-d is not applied with the detection voltage. Thus, a pixel array connected to the first data line 111-d emits light, thereby displaying luminance (refer to FIG. 6).

When a disconnection occurs in the left side or the right side of the detection line 211, and thus a corresponding portion is disconnected, the detection voltage, unlike the case in which the crack detection line 215 is disconnected, is transmitted to the detection line pad 111-c on the opposite side. That is, when the crack is generated in the left side of the detection line 211, the detection voltage passed through the crack detection line 215 is not transmitted to the detection line pad 111-c on the left side, but is transmitted to the detection line pad 111-c on the right side. Accordingly, the detection voltage is transmitted to the first data line 111-d through the right-side detection line pad 111-c, and a pixel array connected to the first data line 111-d does not emit light, thereby detecting no occurrence of cracks at the periphery of the openings 151 and 152.

That is, as shown in FIG. 3 and as described above, according to an exemplary embodiment, although a crack occurs in the detection line 211, a pixel array connected to the first data line 111-d does not emit light, and thus, it is determined that no crack is generated. That is, according to an exemplary embodiment, only when a disconnection occurs in the crack detection line 215 does the corresponding pixel array emit light, thus allowing for the determination that a crack has occurred.

Hereinafter, a structure according to the exemplary embodiment of FIGS. 1 and 2 will be described with respect to the peripheral area (e.g., the bending portion 101 and the driving portion 102) in the display device with reference to FIG. 4.

Figure 4:
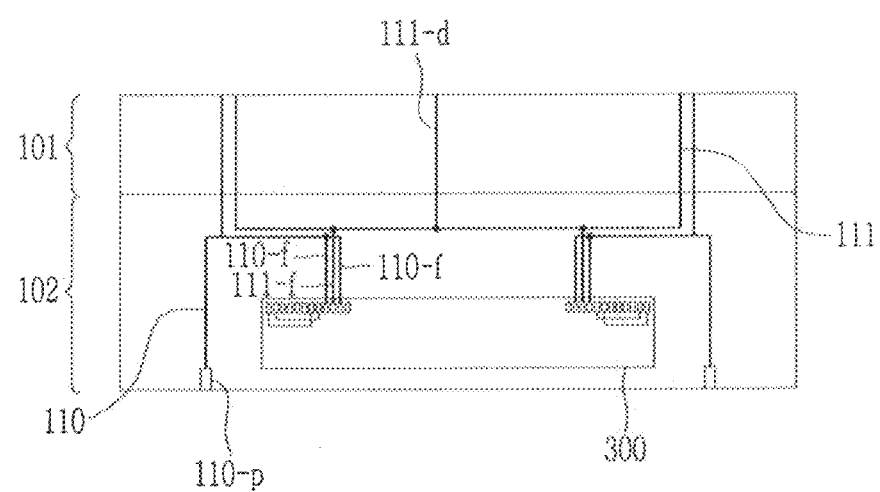
FIG. 4 is detailed view of a peripheral area in the display device of FIG. 1 according to an exemplary embodiment.

FIG. 4 is detailed view of the peripheral area in the display device of FIG. 1 according to an exemplary embodiment.

The peripheral area of the lower display panel 100 includes the driving portion 102 where the driving chip 300 is disposed, and the bending portion 101 that connects the driving portion 102 and the display area.

In the driving portion 102, the driving chip 300, and an input pad and driving signal wires that receive signals from the outside, are formed. In FIG. 4, only a part of the input pad and the driving signal wires are illustrated for convenience of illustration. In addition, the driving chip 300 transmits a data voltage to each data line to display an image, and this is not shown in FIG. 4 for convenience of illustration.

A peripheral voltage application line 110 and a peripheral detection line 111 are formed in the bending portion 101 and the driving portion 102, which are the peripheral area of the lower display panel 100.

The peripheral voltage application line 110 is a wire that transmits a detection voltage applied from the outside or from the driving chip 300. The peripheral voltage application line 110 includes a portion that horizontally extends in the driving portion 102, and a portion extended to the bending portion 101 from the driving portion 102 by being extended from the horizontally extended portion. The peripheral voltage application line 110 is connected to the voltage application line 210 of the upper display panel 200 through the bending portion 101 and the voltage application line pad 110-c. In addition, the peripheral voltage application line 110 includes a portion extended toward a peripheral voltage application line pad 110-p, and receives a detection voltage from the outside through the peripheral voltage application line pad 110-p. In addition, the peripheral voltage application line 110 includes a peripheral voltage application line driving chip connection line 110-f extending toward the driving chip 300, and thus may receive a detection voltage from the driving chip 300. In FIG. 4, two driving chip connection lines 110-f are formed. However, the invention is not limited thereto. For example, according to exemplary embodiments, only one or three or more driving chip connection lines 110-f may be formed. In an exemplary embodiment, the peripheral voltage application line 110 has a structure that is bilaterally symmetrical.

The peripheral detection line 111 enables determination of whether the detection voltage transmitted through the voltage application signal line 10 is also transmitted through the crack detection line 215, or is not transmitted due to a disconnection. Each of the peripheral detection lines 111 has a structure that is bilaterally symmetrical in an exemplary embodiment.

The peripheral detection line 111 includes a portion that horizontally extends in the driving portion 102, and a portion extended to the bending portion 101 in the driving portion 102 by being vertically extended from the horizontally extended portion. The peripheral detection line 111 is connected to the detection line 211 of the upper display panel 200 through the bending portion 101 and the detection line pad 111-c. In addition, the peripheral detection line 111 is connected to the first data line 111-d that is vertically extended. Accordingly, when a crack is generated at the periphery of the openings 151 and 152, causing the crack detection line 215 to become disconnected, the detection voltage is not applied to the first data line 111-d. When no crack is generated at the periphery of the openings 151 and 152, the detection voltage is applied to the first data line 111-d. A pixel array connected to the first data line 111-d operates depending on an applied voltage, and may be set to display luminance when the detection voltage is not applied and to not display luminance when the detection voltage is applied. In this case, each pixel is applied with a data voltage by applying a voltage that can turn on a switching transistor to a gate line in each pixel. In addition, the peripheral detection line 111 includes a driving chip connection line 111-f that extends toward the driving chip 300. Thus, according to exemplary embodiments, it is possible to detect whether the detection voltage is applied in the driving chip 300.

Further, referring to FIG. 1, the pads 110-c and 111-c that are respectively connected to the peripheral voltage application line 110 and the peripheral detection line 111 are formed in the lower display panel 100. The pads 110-c electrically connect the peripheral voltage application line 110 to the voltage application line 210 of the upper display panel 200. The pads 111-c electrically connect the peripheral detection line 111 to the detection line 211 of the upper display panel 200, respectively.

According to exemplary embodiments, the number of openings is not particularly limited. As the number of openings is increased, the number of detection signal lines may be increased.

As described, in the display device according to an exemplary embodiment of FIGS. 1 to 4, the crack detection line 215 is formed in the display panels 100 and 200 to detect a crack, which may be generated while forming the openings 151 and 152. When the crack is generated at the periphery of the opening 151 and 152, the crack detection line 215 is disconnected, and thus, the detection voltage transmitted through the voltage application signal line 10 is not transmitted to the detection signal line 11. Thus, the detection voltage is not transmitted to the first data line 111-*d* that is connected to the detection signal line 11, and a pixel array connected to the first data line 111-*d* displays a specific luminance.

Here, the detection voltage may be a driving voltage ELVDD, which is a high voltage for driving a pixel (e.g., a diode driving portion and an organic light emitting diode), and when the detection voltage is not applied, a low voltage is transmitted to the first data line 111-*d* through the detection signal line 11.

According to exemplary embodiments, since the first data line 111-*d* displays an image by being applied with a data voltage during normal operation, the first data line 111-*d* is not directly connected to the detection signal line 11. That is, when an image is displayed, the first data line 111-*d* is applied with a data voltage supplied from the driving chip 300, and when a crack is detected, a detection voltage may be applied to the first data line 111-*d*. Such a structure will be described with reference to FIG. 5.

Figure 5:
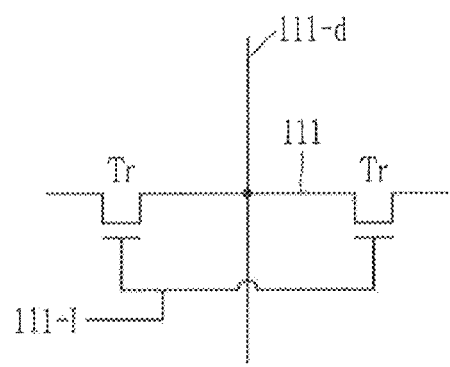
FIG. 5 is a circuit diagram of a structure in which the data line and the detection line are connected to each other in the display device of FIG. 1 according to an exemplary embodiment.

FIG. 5 is a circuit diagram of a structure in which the data line and the detection line are connected to each other in the display device of FIG. 1 according to an exemplary embodiment.

FIG. 5 illustrates a vertically formed first data line 111-*d* and a horizontally formed peripheral detection line 111. The first data line 111-*d* and the peripheral detection line 111 are connected to each other through a transistor Tr disposed therebetween rather than being directly connected to each other.

Here, when the transistor Tr is turned on by an input signal 111-I, the peripheral detection line 111 is connected to the data line 111-*d*. Since no image is displayed when a crack is detected, no data voltage is applied to the data line 111-*d* in the driving chip 300. That is, when the input signal 111-I is applied, the first data line 111-*d* and the peripheral detection line 111 are electrically connected to each other to detect a crack, and thus, a pixel array connected to the first data line 111-*d* to which the detection voltage is not applied displays luminance.

Figure 6:
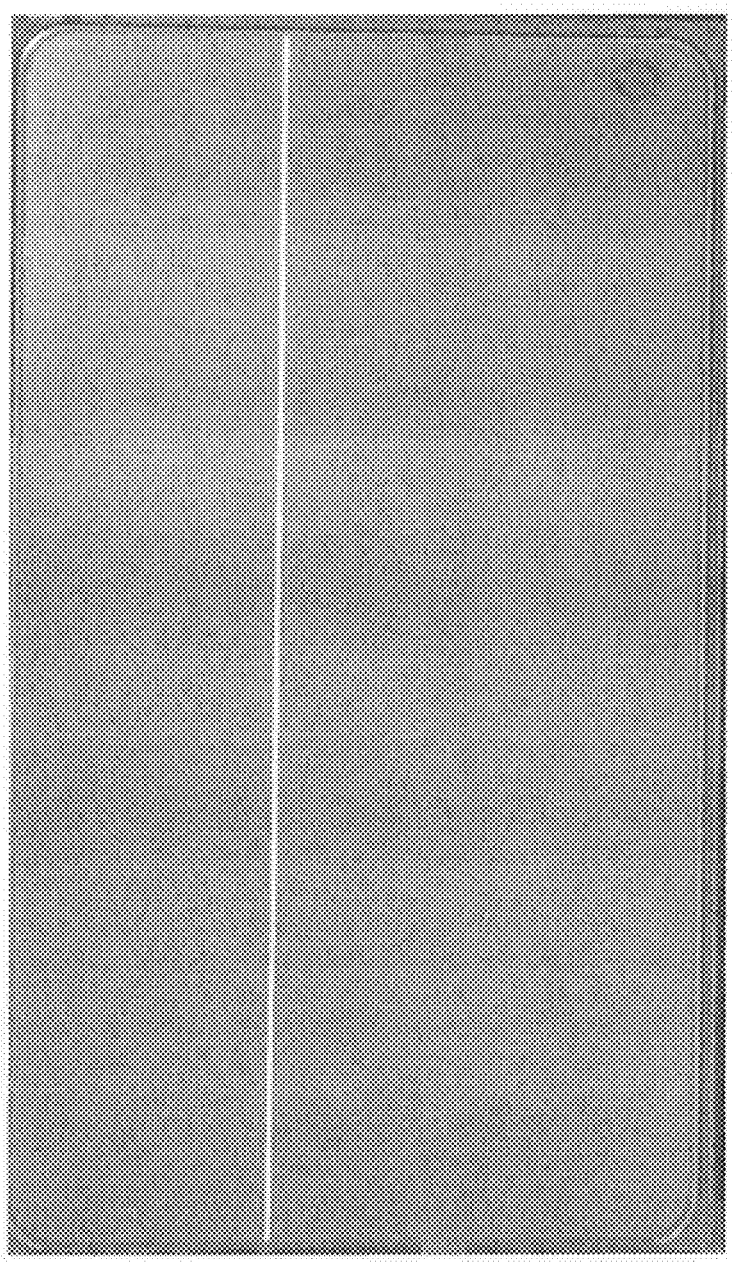
FIG. 6 shows a display device in a case in which a disconnection is detected according to an exemplary embodiment.

When the detection voltage is applied to the first data line 111-*d*, the corresponding pixel array displays luminance as shown in FIG. 6.

FIG. 6 shows a display device in a case in which a disconnection is detected according to an exemplary embodiment.

In FIG. 6, HCD is an abbreviation of hole crack detection. FIG. 6 shows a pixel array displaying luminance when a detection voltage is applied to a first data line 111-*d* that is connected to a detection signal line 11.

Here, the detection voltage may be a driving voltage ELVDD, which is a high voltage for driving a pixel (e.g., a diode driving portion and an organic light emitting diode). When the detection voltage is not applied, a relatively low voltage is transmitted to the first data line 111-*d*. In this case, each pixel is applied with a lower voltage that is applied to the first data line 111-*d* by applying a voltage that can turn on a switching transistor to a gate line in each pixel. A source and a gate of a driving transistor included in each pixel are respectively applied with the driving voltage ELVDD, which is a high voltage, and the low voltage is input from the first data line 111-*d* such that the driving transistor outputs an output current to the organic light emitting diode. Thus, the organic light emitting diode emits light, and luminance is displayed along pixel arrays as shown in FIG. 6.

On the contrary, when the detection voltage is applied to the first data line 111-*d*, the source and the gate of the driving transistor included in each pixel are applied with the same high voltage, which is the driving voltage ELVDD. Thus, the driving transistor does not generate an output current, and no output current is transmitted to the organic light emitting diode. As a result, luminance is not displayed.

Hereinabove, a structure in which a crack generated at the periphery of the openings 151 and 152 is detected has been described. According to exemplary embodiments, a configuration that detects a crack generated in the display panel or in the bending portion 101 may be further provided.

Additional configurations for detection of a crack will now be described with reference to FIG. 7 and FIG. 8.

Figure 7:
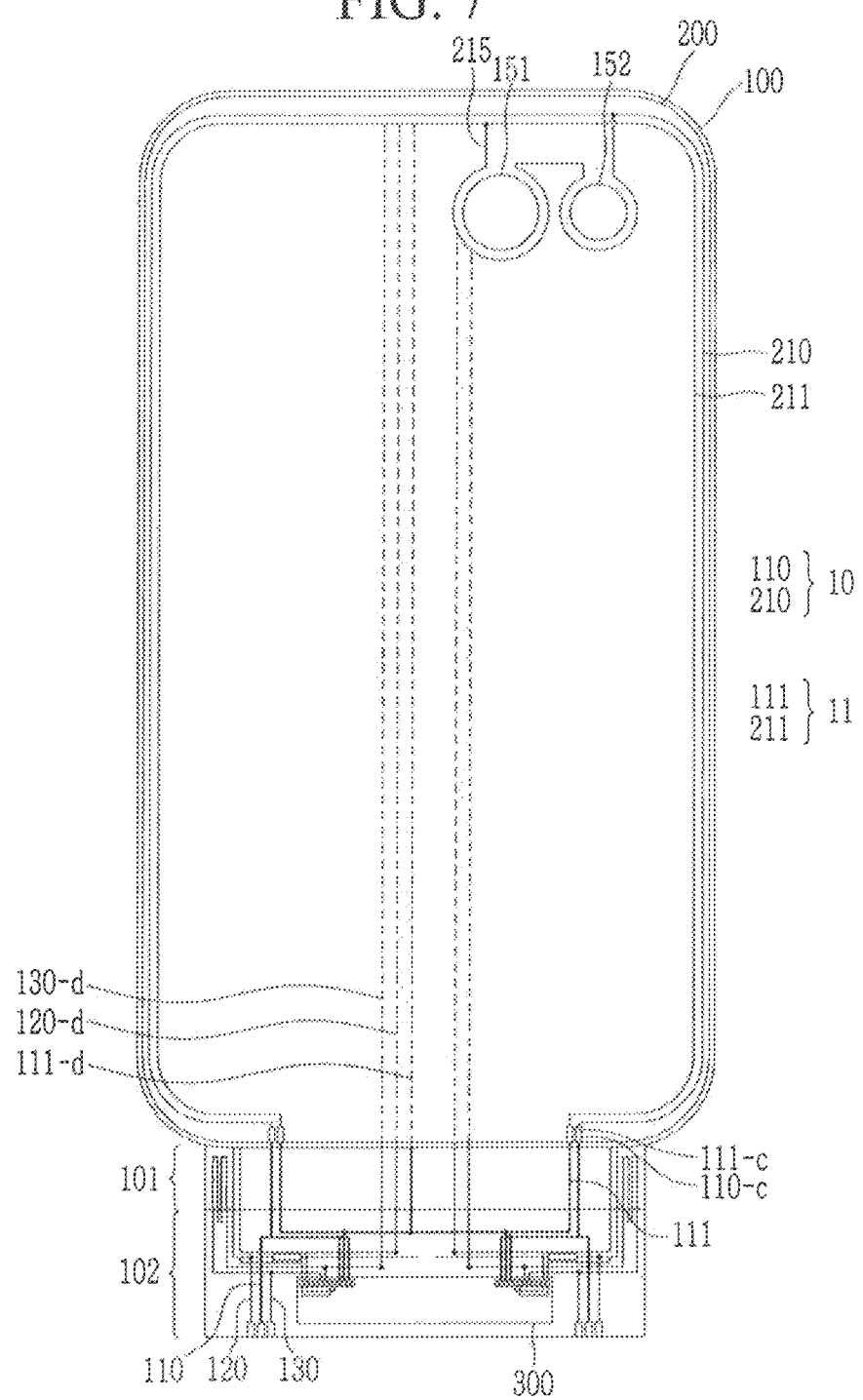
FIG. 7 is a top plan view of a display device according to an exemplary embodiment.
Figure 8:
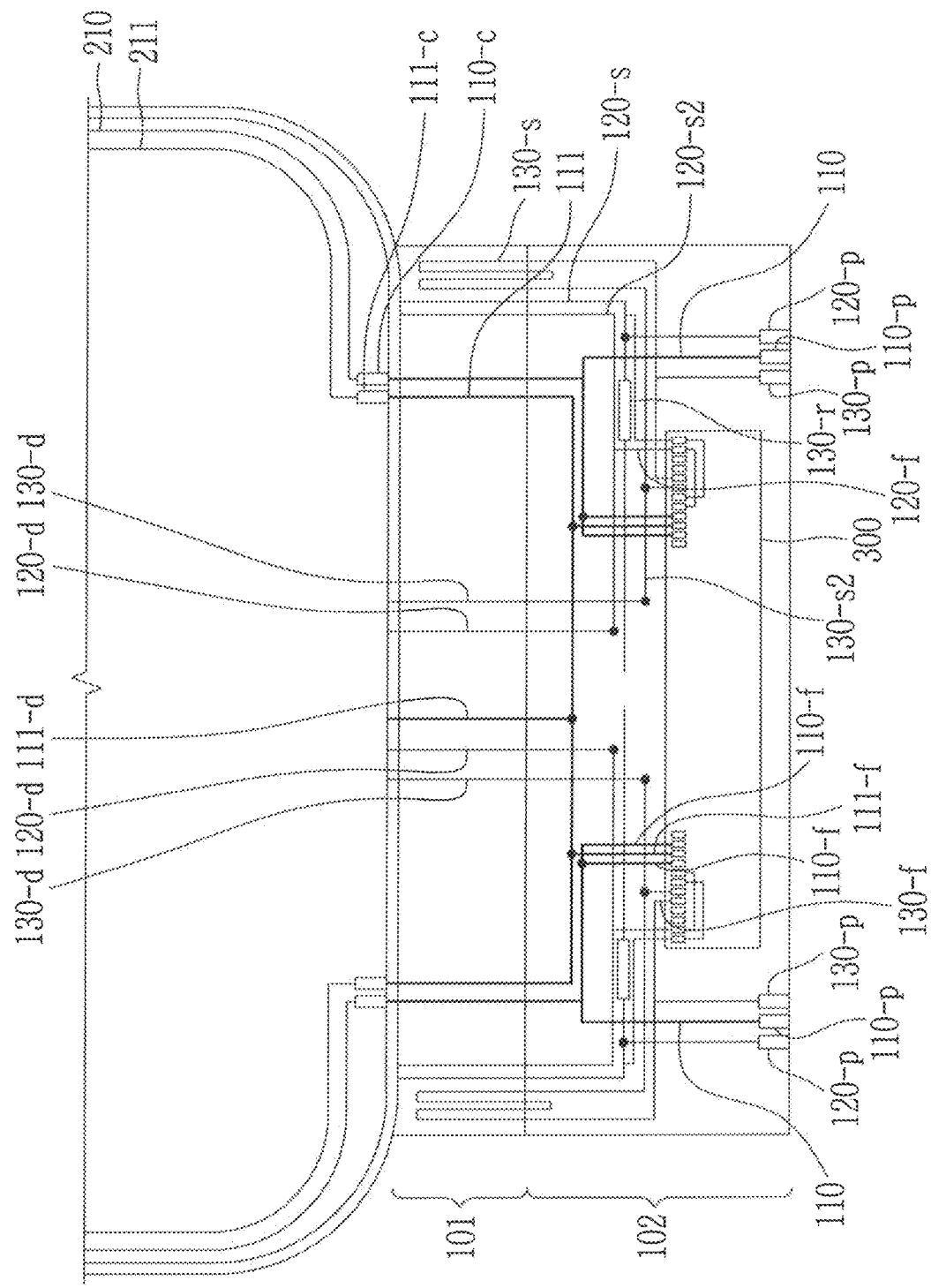
FIG. 8 is detailed view of the periphery of a driving portion in the display device of FIG. 7.

FIG. 7 is a top plan view of a display device according to an exemplary embodiment, and FIG. 8 is detailed view of the periphery of a driving portion in the display device of FIG. 7.

FIGS. 7 and 8 illustrate thick/bold lines and thin lines in the peripheral area (e.g., the bending portion 101 and the driving portion 102). The thick/bold lines indicate a wire having the same structure as shown in the exemplary embodiment of FIG. 1, which implies a configuration for detection of a crack. Wires not in FIG. 1 are illustrated as thin lines in FIGS. 7 and 8 for clarity.

Hereinafter, a configuration according to an exemplary embodiment will be described with reference to FIGS. 7 and 8.

In the exemplary embodiment of FIGS. 7 and 8, in addition to a wire that detects a crack at the periphery of openings, a wire 120 that detects a crack in display panels 100 and 200 and a wire 130 that detects a crack in a bending portion 101 are additionally included. The wire 120 (also called a display panel crack detection wire) that detects a crack in the display panels 100 and 200 and the wire 130 (also called a bending portion crack detection wire) that detects a crack in the bending portion 101 generally have a structure of a long wire having one input end and one output end, and receive a detection voltage through the input ends and the output ends that are respectively connected to data lines 120-*d* and 130-*d*.

The wire 120 detecting a crack in the display panels 100 and 200 is formed in the lower display panel 100. The wire 120 extends to the display area of the lower display panel 100. The extended wire is disposed along an outer edge of the display area of the lower display panel 100, and has a loop structure. The wire 120 receives the detection voltage, and transmits the detection voltage through the wire 120. As a result, the detection voltage also flows along an outer edge of the lower display panel 100, and then the detection voltage is transmitted back to the driving portion 102 because of the loop structure of the extended wire. When no crack is generated in the lower display panel 100, and thus the wire 120 is not disconnected, the detection voltage returns to the driving portion 102. An input end of the wire 120 that detects a crack of the display panels 100 and 200 receives the detection voltage, and an output end thereof is connected to the data line 120-*d*. When the wire 120 that detects a crack of the display panels 100 and 200 is not disconnected, the detection voltage is transmitted to the data line 120-*d*, but when the wire 120 is disconnected, the detection voltage is not transmitted to the data line 120-*d* such that a pixel array connected to the data line 120-*d* displays a constant luminance.

The wire 130 detecting a crack of the bending portion 101 is formed in the driving portion 102 and the bending portion 101 of the lower display panel 100. The wire in the bending portion 101 has a loop structure. The wire 130 receives the detection voltage, and transmits the detection voltage through the wire 130. Thus, the detection voltage is transmitted to the bending portion 101, and is then transmitted back to the driving portion 102 because of the loop structure of the wire in the bending portion 101. When no crack is generated in the bending portion 101, and thus the wire 130 is not disconnected, the detection voltage returns to the driving portion 102. An input end of the wire 130 that detects a crack of the bending portion 101 receives the detection voltage, and an output end thereof is connected to the data line 130-*d*. When the wire 130 that detects the crack of the bending portion 101 is not disconnected, the detection voltage is transmitted to the data line 130-*d*, but when the wire 130 is disconnected, the detection voltage is not transmitted to the data line 130-*d* such that a pixel array connected to the data line 130-*d* displays a constant luminance.

Input ends of the wire 120 that detects a crack of the display panels 100 and 200 and the wire 130 that detects a crack of the bending portion 101 are connected to the outside, and thus may receive a detection voltage from the outside. According to exemplary embodiments, these input ends may receive the detection voltage from a driving chip 300.

In addition, according to exemplary embodiments, input ends of the wire 120 that detects a crack of the display panels 100 and 200 and the wire 130 that detects a crack of the bending portion 101 are connected to the driving chip 300 rather than being connected to the data lines 120-*d* and 130-*d*. Thus, whether a detection voltage is transmitted from the driving chip 300 can be checked.

A detailed structure of the wire 120 that detects a crack of the display panels 100 and 200 and the wire 130 that detects a crack of the bending portion 101 will be described with reference to FIG. 8.

The wire 120 that detects a crack of the display panels 100 and 200 includes two wiring portions 120-*s* and 120-*s*2 that horizontally extend in the driving portion 102. A first wiring portion 120-*s* thereof is connected to one end of the wire 120, and a second wiring portion 120-*s*2 thereof is connected to an output end of the wiring 120. The first wiring portion 120-*s* further includes a portion that vertically extends and thus extends toward a display panel crack detection pad 120-*p*, and receives a detection voltage from the outside through the display panel crack detection pad 120-*p*. In addition, the first wiring portion 120-*s* further includes a driving chip connection line 120-*f* for display panel crack detection, extending toward the driving chip 300, and thus receives a detection voltage from the driving chip 300. The first wiring portion 120-*s* also may have a resistor 130-*r* to match resistance between The first wiring portion 120-*s* and the second wiring portion 120-*s*2.

The first wiring portion 120-*s* includes a detection portion that vertically extends therefrom and thus extends to the lower display panel 100 while passing through the bending portion 101 from the driving portion 102. The detection portion has a wiring structure of being formed along an outer edge of the display area of the lower display panel 100, and returns along the same outer edge so as to be connected to the second wiring portion 120-*s*2.

The second wiring portion 120-*s*2 is connected to the data line 120-*d*, and may be connected to the driving chip 300 according to exemplary embodiments. A connection between the second wiring portion 120-*s*2 and the data line 120-*d* may be similar to the structure shown in FIG. 5.

Referring to FIGS. 7 and 8, the wire 120 that detects a crack of the display panels 100 and 200 is provided as a pair in each of the left side and the right side.

The wire 130 that detects a crack of the bending portion 101 includes two wiring portions 130-*s* and 130-*s*2 that horizontally extend in the driving portion 102. A first wiring portion 130-*s* thereof is connected to an input end of the wire 130, and a second wiring portion 130-*s*2 thereof is connected to an output end of the wire 130. The first wiring portion 130-*s* further includes a portion that vertically extends and thus extends toward a bending portion crack detection pad 130-*p*, and receives a detection voltage from the outside through the bending portion crack detection pad 130-*p*. In addition, the first wiring portion 130-*s* further includes a driving chip connection line 130-*f* for bending portion crack detection, extended toward the driving chip 300, and may receive the detection voltage from the driving chip 300.

The first wiring portion 130-*s* includes a detection portion that vertically extends from the first wiring portion 130-*s* and extends to the bending portion 101 from the driving portion 102. As shown in FIGS. 7 and 8, the detection portion has a wiring structure in which the detection portion reciprocates several times between the bending portion 101 and the driving portion 102 in the bending portion 101, and is then connected to the second wiring portion 130-*s*2.

The second wiring portion 130-*s*2 is connected to the data line 130-*d*, and may be connected to the driving chip 300 according to exemplary embodiments. A connection between the second wiring portion 130-*s*2 and the data line 130-*d* may be similar to the structure shown in FIG. 5.

Referring to FIGS. 7 and 8, the wire 130 that detects a crack of the bending portion 101 is provided as a pair in each of the left side and the right side.

In the exemplary embodiment of FIG. 7, in addition to being able to detect a crack at the periphery of the openings 151 and 152, a crack of the display panel (e.g., the lower display panel 100 in the exemplary embodiment of FIG. 7) or a crack of the bending portion 101, which is a folded portion, can also be detected. When the crack is generated in the display panels 100 and 200 or in the bending portion 101, the wires 120 and 130 that detect the crack are disconnected so that the detection voltage is not transmitted to the data lines 120-*d* and 130-*d*.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A display device, comprising:
    a display panel comprising an opening, a lower display panel comprising a bending portion and a driving portion, and an upper display panel disposed on the lower display panel;
    a crack detection line disposed along a periphery of the opening;
    a plurality of data lines connected to a plurality of pixels, wherein the opening is surrounded by a display area displaying an image, and wherein the crack detection line is connected to one of the plurality of data lines, and detects a crack at the periphery of the opening through a single pixel array connected to the one of the plurality of data lines; and a voltage application signal line comprising a voltage application line disposed in the upper display panel and a peripheral voltage application line disposed in the lower display panel.

2. The display device of claim 1, wherein a first end of the crack detection line receives a detection voltage through the voltage application signal line.

3. The display device of claim 2, wherein a second end of the crack detection line is connected to a detection signal line, and the detection signal line is connected to the one of the plurality of data lines.

4. The display device of claim 3, wherein the detection signal line comprises a detection line disposed in the upper display panel and a peripheral detection line disposed in the lower display panel.

5. The display device of claim 4, wherein the peripheral detection line is disposed across the bending portion and the driving portion in the lower display panel.

6. The display device of claim 5, wherein the detection line and the peripheral detection line are electrically connected to each other through a detection line pad.

7. The display device of claim 1, wherein the lower display panel comprises the display area comprising the plurality of pixels, and a peripheral area disposed near the display area, the bending portion and the driving portion are disposed in the peripheral area, and the bending portion and the driving portion protrude in one direction away from the display area.

8. The display device of claim 7, wherein the opening is disposed in the display area.

9. The display device of claim 7, wherein at least one of the plurality of pixels comprises an organic light emitting diode and a driving transistor that supplies a current to the organic light emitting diode.

10. The display device of claim 7, further comprising:
a display panel crack detection wire that detects a crack of the display panel.

11. The display device of claim 10, wherein a first end of the crack detection line receives a detection voltage through the voltage application signal line, and wherein a first end of the display panel crack detection wire receives the detection voltage, and a second end of the display panel crack detection wire is connected to the one of the plurality of data lines.

12. The display device of claim 11, wherein the display panel crack detection wire is disposed across the bending portion and the driving portion of the lower display panel and an outer edge of the display area.

13. The display device of claim 1, wherein the peripheral voltage application line is disposed across the bending portion and the driving portion of the lower display panel.

14. The display device of claim 1, wherein the voltage application line and the peripheral voltage application line are electrically connected to each other through a voltage application line pad.

15. The display device of claim 1, wherein the upper display panel comprises a touch sensor that senses a touch.

16. The display device of claim 1, further comprising:
a bending portion crack detection wire that detects a crack in the bending portion.

17. The display device of claim 16, wherein a first end of the crack detection line receives a detection voltage through the voltage application signal line, and wherein a first end of the bending portion crack detection wire receives the detection voltage, and a second end of the bending portion crack detection wire is connected to the one of the plurality of data lines.

18. The display device of claim 17, wherein the bending portion crack detection wire is disposed across the bending portion and the driving portion of the lower display panel.

* * * * *